(12) United States Patent
Verburg (10) Patent No.: US 12,304,001 B2
(45) Date of Patent: May 20, 2025

(54) OPTIMISED LASER CUTTING

(71) Applicant: ASMPT SINGAPORE PTE. LTD., Singapore (SG)

(72) Inventor: Paul Verburg, Nijmegen (NL)

(73) Assignee: ASMPT SINGAPORE PTE. LTD. (SG)

( * ) Notice: Subject to any disclaimer, the term of this patent is extended or adjusted under 35 U.S.C. 154(b) by 127 days.

(21) Appl. No.: 16/372,536

(22) Filed: Apr. 2, 2019

(65) Prior Publication Data
US 2020/0316722 A1    Oct. 8, 2020

(51) Int. Cl.
| | |
|---|---|
| B23K 26/364 | (2014.01) |
| B23K 26/0622 | (2014.01) |
| B23K 26/08 | (2014.01) |
| B23K 26/402 | (2014.01) |
| B23K 26/53 | (2014.01) |
| H10D 84/08 | (2025.01) |
| B23K 103/00 | (2006.01) |

(52) U.S. Cl.
CPC ........ B23K 26/364 (2015.10); B23K 26/0624 (2015.10); B23K 26/083 (2013.01); B23K 26/402 (2013.01); B23K 26/53 (2015.10); H10D 84/08 (2025.01); B23K 2103/56 (2018.08)

(58) Field of Classification Search
CPC .. B23K 26/364; B23K 26/0624; B23K 26/53; B23K 26/083; B23K 26/402; B23K 2103/56; H01L 21/8258
See application file for complete search history.

(56) References Cited

U.S. PATENT DOCUMENTS

| | | | | |
|---|---|---|---|---|
| 7,428,253 | B2* | 9/2008 | Murison | H01S 3/06754 372/20 |
| 2005/0218122 | A1* | 10/2005 | Yamamoto | B23K 26/0622 219/121.61 |
| 2008/0176147 | A1* | 7/2008 | Wagner | B23K 26/0648 430/5 |
| 2012/0111841 | A1* | 5/2012 | Murison | B23K 26/382 219/121.71 |
| 2015/0166395 | A1* | 6/2015 | Marjanovic | B32B 17/10 428/131 |
| 2015/0166396 | A1* | 6/2015 | Marjanovic | B23K 26/04 428/137 |
| 2017/0066079 | A1* | 3/2017 | Reisse | B23K 26/127 |
| 2019/0001442 | A1* | 1/2019 | Unrath | B23K 26/0622 |
| 2020/0101561 | A1* | 4/2020 | Ortner | B23K 26/083 |

FOREIGN PATENT DOCUMENTS

| | | | | |
|---|---|---|---|---|
| KR | 20130069593 A | * | 6/2013 | ............. B23K 26/40 |
| WO | WO 97/29509 A1 | | 8/1997 | |

* cited by examiner

Primary Examiner — Elizabeth M Kerr
(74) Attorney, Agent, or Firm — OSTROLENK FABER LLP (57) ABSTRACT

A method of cutting a wafer by irradiating the wafer with laser energy, comprises emitting a sequence of successive laser beam pulses having a first set of laser beam pulses and a second set of laser beam pulses, the first set of laser beam pulses comprising: laser beam pulses having respective pulse widths in the range from 0.1 to 300 nanoseconds, or a plurality of bursts of laser beam pulses having an inter-burst spacing in the range from 0.1 to 100 nanoseconds, each pulse within the bursts having a pulse width of 100 picoseconds or less, and the second set of laser beam pulses comprising laser beam pulses having pulse widths of 100 picoseconds or less.

11 Claims, 5 Drawing Sheets

OPTIMISED LASER CUTTING

This invention relates to a method of cutting a wafer by irradiating the wafer with laser energy and laser cutting apparatus for cutting a wafer.

Background and Prior Art

Singulation and scribing are well-known processes in the semiconductor industry, in which a cutting machine is used to work a workpiece or substrate such as a semiconductor wafer, which could for example comprise silicon but is not so limited, or metal and/or ceramic wafers. Throughout this specification, the term "wafer" is used to encompass all these products. In a singulation process (also referred to as dicing, severing, cleaving for example), a wafer is completely cut through such as to cingulate the wafer into individual dies. In a scribing process (also referred to as grooving, scoring, gouging or furrowing for example), a channel or groove is cut into a wafer. Other processes may be applied subsequently, for example full singulation by using a physical saw along the cut channels. Alternatively or additionally, holes may be formed in a wafer using a drilling process. Throughout the present specification, the term "cutting" will be used to encompass singulation, scribing and drilling.

However, the overall semiconductor technology trend in miniaturization is to decrease the thickness of the wafer, and as wafer thicknesses decrease, it has been shown that laser technology becomes more advantageous for singulation than the use of a mechanical saw. Exploiting high-power lasers for such material processing has significant advantages in comparison with mechanical counterparts such as, for instance, drilling and sawing, and laser processing has a great versatility in coping with small and delicate workpieces.

Laser removal of the semiconductor material occurs due to a rapid temperature increase of a relatively small area in which the laser beam is focused, which causes local material to melt, explosively boil, evaporate and ablate. Laser singulation has challenging requirements, including the delicate balance between the process throughput and the workpiece (die) quality. The quality and throughput of the process are determined by laser parameters such as fluence, pulse width, repetition rate, polarisation as well as distribution of the polarisation, wavefront shape and its phase modification and wavelength. Typically, nanosecond laser pulses, i.e. laser pulses having a pulse-width in the order of nanoseconds, are used which provide an acceptable balance of quality and throughput.

Existing laser cutting or scribing systems for semiconductor, metal and/or ceramic wafers employ pulsed lasers with a fixed pulse duration or a pulse duration that can be varied in a limited range. The spacing between the laser pulses can be equal. Alternatively, pulse trains (bursts) can be employed. The time duration between the pulses inside a burst is shorter compared to the time between subsequent bursts.

It has been proposed to use a multiple beam laser cutting approach, for example in WO 1997/029509 A1, wherein a linear cluster of focused laser beams, which may be arranged in a linear array of laser spots, is used to ablate substrate material along a scribe-line, thus causing the substrate to be radiatively scored along the line of ablation. The use of multiple beams in this manner as opposed to a single (more powerful) beam may provide various advantages, in particular a reduction in the defect density created during the cutting process.

One of the quantitative assessments of the laser process quality is the die or wafer fracture strength, which determines a tensile stress at which the wafer breaks. Uniaxial flexure tests are commonly employed for the determination of fracture strength for brittle materials and have been adopted for wafer strength measurements. These tests include three- and four-point bending tests, which are commonly used to measure fracture strength.

It is believed that the fracture strength of the laser-separated wafers depends on the level of laser-induced defects such as micro-cracks and chip-outs, which appear after the laser singulation process in the wafer. These defects are generated by a high stress at the interface between the bulk semiconductor material and the local laser-processed area. The high stress is produced by high temperature gradients between the bulk and processed zones by acoustic shock waves emerging during the process and chemical transformations of the process side walls of the die. The region of the semiconductor material which contains such defects is commonly referred to as the "heat-affected zone". The fracture strength is typically different for the front and back sides of the wafer, and indeed there are techniques, processes and wafer layouts which can result in significantly different back-side and top-side strengths.

Recent advances in ultrashort pulse ("USP") lasers enable wafer processing to be performed more delicately, since the temporal pulse widths of those lasers are shorter than the typical times of electron-phonon relaxation in solids, which is responsible for heat transfer from photo-excited electrons to the lattice, the pulse width being less than 1-10 ps depending on the particular material being processed. USP lasers can provide an improvement to the die strength of the material, however the productivity of wafer processing systems using such USP lasers is reduced due to numerous reasons, including for example the smaller heat diffusion-induced interaction volume produced with such systems. Moreover, a stronger variation in the cutting or scribing depth is often observed.

The present invention seeks to combine the advantages of different laser pulse durations in a single, optimised system.

In accordance with the present invention this aim is achieved by the application of laser beam pulses of different pulse widths throughout an irradiation sequence.

In this way the wafer that is to be processed is irradiated with both ultra-short pulses and nanosecond pulses or burst envelopes. These pulses could be generated by a single or by multiple laser sources. A nanosecond burst envelope consists of a plurality of ultra-short pulses with a spacing in the nanosecond domain, and such a burst can simulate the behaviour of a nanosecond pulse to a certain extent. An advantage of using such a burst is that it can be generated by same laser source as the ultra-short pulses in a straightforward manner.

One implementation could be to create an alternating pattern of ultra-short pulses and nanosecond pulses or nanosecond burst envelopes.

Another implementation could be to first irradiate the wafer with nanosecond pulses or nanosecond burst envelopes followed by a post-processing step with ultra-short pulses.

Both implementations share the same working principle: the ultra-short pulses should remove part or all of the damage created by the nanosecond pulses or nanosecond burst envelopes. The damage may manifest as chipping, voids, micro-cracks, surface roughness and/or waviness or phase-transformed material.

SUMMARY OF THE INVENTION

In accordance with a first aspect of the present invention there is provided a method of cutting a wafer by irradiating the wafer with laser energy, comprising the steps of:
 i) providing a laser source adapted to emit a sequence of successive laser beam pulses,
 ii) emitting laser beam pulses from the laser source,
 iii) guiding the emitted laser beam pulses to irradiate a wafer to be cut, and
 iv) moving the wafer relative to the irradiating laser beam pulses to cut the wafer along a cutting line,
wherein the sequence of laser beam pulses comprises:
first and second sets of laser beam pulses,
the first set comprising:
 at least one laser beam pulse having a pulse width in the range from 0.1 to 300 nanoseconds, or
 at least one burst of laser beam pulses, each pulse within the burst having a pulse width of 100 picoseconds or less, and
the second set comprising at least one laser beam pulse having a pulse width of 100 picoseconds or less.

In accordance with a second aspect of the present invention there is provided a laser cutting apparatus for performing the method of claim 1.

In accordance with a third aspect of the present invention there is provided a laser cutting apparatus for cutting a wafer, comprising:
 a laser source adapted to emit a sequence of successive laser beam pulses, the sequence comprising first and second sets of laser beam pulses, the first set comprising at least one laser beam pulse having a pulse width in the range from 0.1 to 300 nanoseconds, or at least one burst of laser beam pulses, each pulse within the burst having a pulse width of 100 picoseconds or less, and the second set comprising at least one laser beam pulse having a pulse width of 100 picoseconds or less,
 a laser beam guiding assembly for directing the laser beam pulses from the laser source to irradiate a wafer to be cut, and
 a driving assembly for relatively moving the semiconductor material and the irradiating laser beam pulses.

Other specific aspects and features of the present invention are set out in the accompanying claims.

BRIEF DESCRIPTION OF THE DRAWINGS

The invention will now be described with reference to the accompanying drawings (not to scale), in which.

DETAILED DESCRIPTION OF THE PREFERRED EMBODIMENTS OF THE INVENTION

The present invention makes use of irradiation schemes in which sequences of successive laser beam pulses are emitted by a laser source. All of these irradiation schemes comprise a sequence which includes at least two sets or "subsequences" of pulses. In the first set, the emitted laser beam pulse or pulses are intended to achieve a good material removal rate, while in the second set at least one ultra-short pulse (for example with a pulse width in the picosecond or femtosecond range) is emitted which is intended to improve the quality of the irradiated wafer, including its mechanical strength. In various of these irradiation schemes, the sequences may cyclically repeat. In different embodiments of the present invention, the first set may variously comprise:
 a. A single nanosecond pulse with a duration (pulse width) which lies in the range from 1 ns to 300 ns;
 b. A plurality of nanosecond pulses each with a duration (pulse width) which lies in the range from 1 ns to 300 ns. The number of pulses may be sufficient for cutting/scribing/grooving an entire wafer;
 c. A single burst of ultra-short pulses such as pulses with pulse widths in the picosecond or femtosecond range ("pico-/femtosecond pulses"), each pulse within the burst having a pulse width of 100 picoseconds or less; or
 d. A plurality of bursts of ultra-short pulses, each pulse within the bursts having a pulse width of 100 picoseconds or less. The number of bursts may be sufficient for cutting/scribing/grooving an entire wafer.

In different embodiments of the present invention, the second set may variously comprise:
 a. A single ultra-short pulse having a pulse widths of 100 picoseconds or less; or
 b. A plurality of ultra-short pulses having pulse widths of 100 picoseconds or less. The number of pulses may be sufficient for post-processing of an entire wafer. This plurality preferably does not form a burst as understood by those skilled in the art, since the inter-pulse spacing would preferably lie in the range from 10 ns to 1 ms.

An advantage of using bursts of ultra-short pulses instead of nanosecond pulses is that it is much more straightforward to create those from a standard ultra-short pulse laser compared to nanosecond pulses.

FIGS. 1 to 4 schematically show respective irradiation schemes in accordance with embodiments of the present invention, with these figures showing a single pulse sequence of the scheme.

To some extent these schemes are interchangeable if the timing parameters are varied in a wide range. All the schemes are repetitive, so that the sequences shown may be repeated to produce the entire scheme. When completing the pulse sequence, the sequence can be restarted from the beginning after an additional time delay. The schemes can be considered to illustrate what an extremely fast photodiode at the wafer surface would measure.

Figure 1:
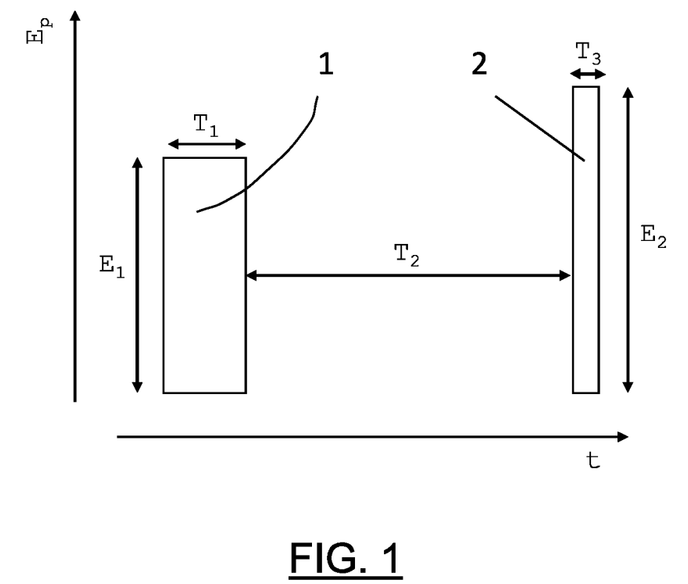
FIG. 1 schematically shows a timing diagram of an irradiation scheme in accordance with an embodiment of the present invention.

A timing diagram of an irradiation scheme in accordance with an embodiment of the present invention is schematically shown in FIG. 1. This irradiation scheme comprises a sequence of laser beam pulses having a first set of pulses 1 with pulse widths in the nanosecond-range and a second set of pulses 2 with pulse widths in the picosecond or femtosecond range. In this scheme the pulse duration is switched after each pulse, so that the sequence comprises alternate pulses from the first and second sets.

As shown in FIG. 1:
"$E_p$" represents the energy of individual laser pulses, which corresponds to the intensity of the laser beam during the pulse;
"t" represents time;
$T_1$, the duration of each pulse 1, lies in the range from 1 ns to 300 ns;
$T_2$, the inter-pulse spacing between each nanosecond pulse 1 and the immediately succeeding pico-/femtosecond pulse 2, lies in the range from 100 ps to 1 ms; and
$T_3$, the duration of each pico-/femtosecond pulse 2, lies in the range from 10 fs to 100 ps.
$E_1$, the energy of the nanosecond pulses 1, and $E_2$, the energy of the pico-/femtosecond pulses 2, may differ. In the sequence shown in FIG. 1, the energy of the pico-/femtosecond pulses 2 is greater than the energy of the nanosecond pulses 1. A typical sequence repetition rate, i.e. the frequency of repetition of the sequence shown in FIG. 1 would lie in the range 1 kHz to 100 MHz, and the sequence would be interrupted (gated) during indexing.

Figure 2:
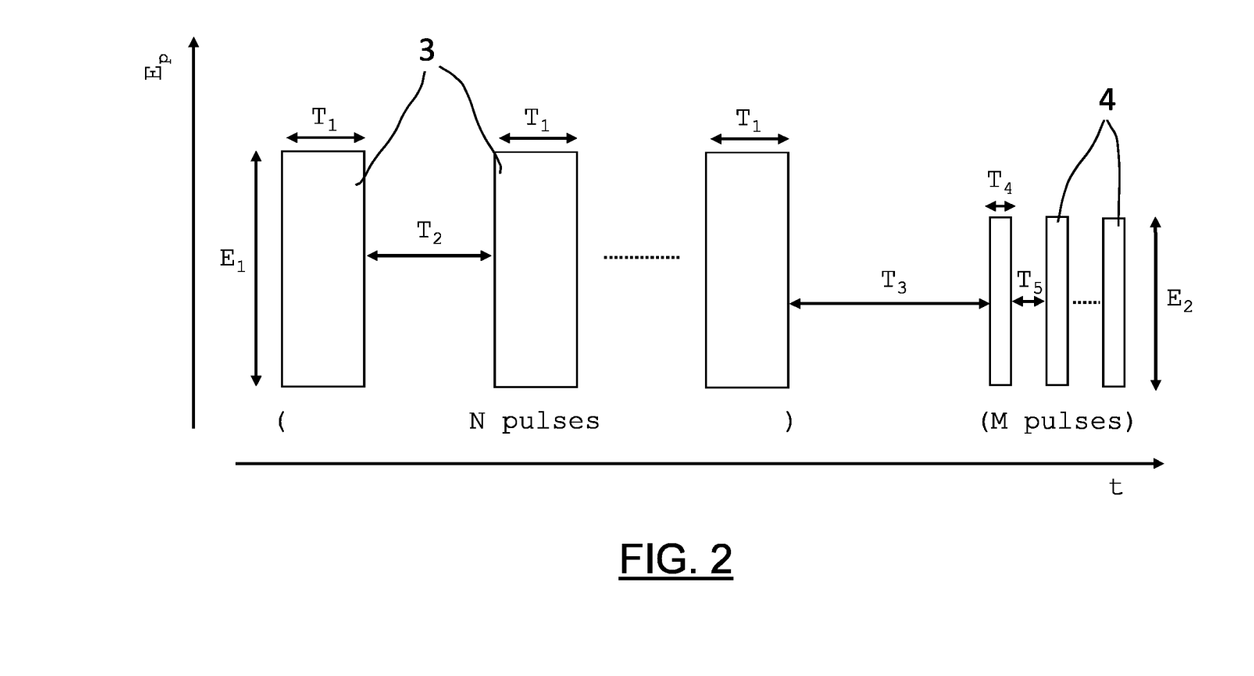
FIG. 2 schematically shows a timing diagram of an irradiation scheme in accordance with a second embodiment of the present invention.

A timing diagram of an irradiation scheme in accordance with a second embodiment of the present invention is schematically shown in FIG. 2. Here, within each sequence, a first set comprising a plurality, potentially a very large number, of pulses 3 with pulse widths in the nanosecond range may be emitted before switching to a second set comprising a plurality of pulses 4 having pulse widths in the pico-/femtosecond range.

As shown in FIG. 2:
"Ep" represents the energy of individual laser pulses, which corresponds to the intensity of the laser beam during the pulse;
"t" represents time;
$T_1$, the duration of each pulse 3, lies in the range from 1 ns to 300 ns;
$T_2$, the inter-pulse spacing between successive nanosecond pulses 3, lies in the range from 1 µs to 1 ms;
$T_3$ represents the inter-pulse spacing between the final nanosecond pulse 3 in the sequence and the immediately succeeding pico-/femtosecond pulse 4. The value of $T_3$ is governed by the pulse duration switching delay;
$T_4$, the duration of each pico-/femtosecond pulse 4, lies in the range from 10 fs to 100 ps;
$T_5$, the inter-pulse spacing between successive pico-/femtosecond pulses 4, lies in the range from 10 ns to 1 ms;
N, the number of nanosecond pulses 3 in the sequence, lies in the range $1 \leq N < \infty$;
M, the number of pico-/femtosecond pulses 4 in the sequence, lies in the range $1 \leq M < \infty$.

The sequence in FIG. 2. could be as long as the processing time for an entire wafer (for example from about one minute to over an hour). For example, the single sequence shown could be employed to cut a wafer using nanosecond pulses and then post-process with ultra-short pulses. Therefore this sequence need not be repeated while processing a single groove or cut-line in the wafer.

$E_1$, the energy of the nanosecond pulses 3, and $E_2$, the energy of the pico-/femtosecond pulses 4, may differ. In the sequence shown in FIG. 2, the energy of the pico-/femtosecond pulses 4 is lower than the energy of the nanosecond pulses 3.

A possible application of this scheme is to cut a dicing street or an entire wafer with nanosecond pulses 3, and subsequently post-process it with pico-/femtosecond pulses 4.

Figure 3:
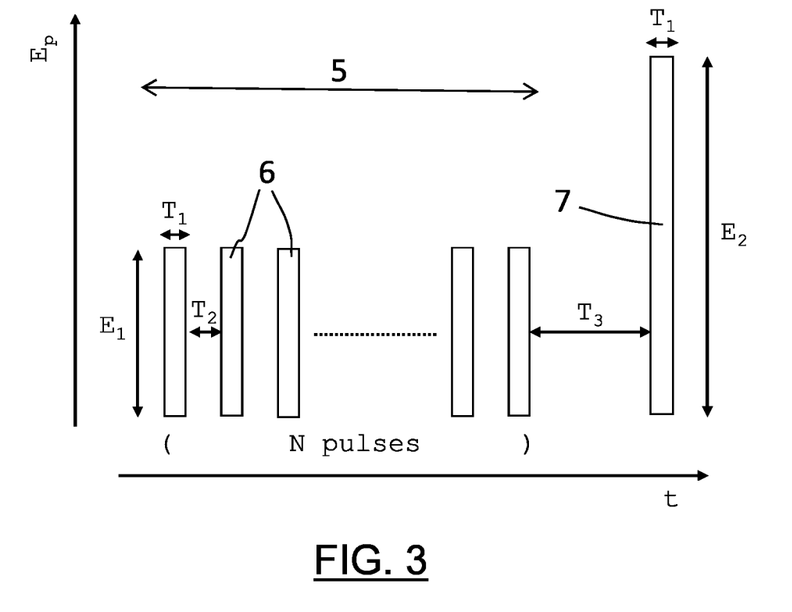
FIG. 3 schematically shows a timing diagram of an irradiation scheme in accordance with a third embodiment of the present invention.

A timing diagram of an irradiation scheme in accordance with a third embodiment of the present invention is schematically shown in FIG. 3. This irradiation scheme uses a pulse sequence comprising a first set comprising a burst 5 of a number N of pico-/femtosecond pulses 6, with a second set comprising a relatively high-energy pico-/femtosecond pulse 7 at the end of the sequence.

As shown in FIG. 3:
"Ep" represents the energy of individual laser pulses, which corresponds to the intensity of the laser beam during the pulse;
"t" represents time;
$T_1$, the duration of each pulse 6, lies in the range from 10 fs to 100 ps;
$T_2$, the inter-pulse spacing between successive pico-/femtosecond pulses 6 within burst 5, lies in the range from 100 ps to 100 ns;
$T_3$ represents the inter-pulse spacing between the final pico-/femtosecond pulse 6 of burst 5 and the following pico-/femtosecond pulse 7, and lies in the range from 100 ps to 100 ns;
N, the number of pico-/femtosecond pulses 6 in burst 5, lies in the range $2 \leq N \leq 100$; and
$E_2$, the energy of pico-/femtosecond pulse $7 \gg E_1$, the energy of each pico-/femtosecond pulse 6 in burst 5.

The burst 5 of pico-/femtosecond pulses 6 acts similarly to a single nanosecond pulse, and so the scheme of FIG. 3 is conceptually similar to the scheme shown in FIG. 1. However, the scheme of FIG. 3 may be simpler to produce in practice than the scheme of FIG. 1 since the laser source may exclusively emit pico-/femtosecond pulses, rather than switching between pico-/femtosecond pulses and nanosecond pulses.

A typical sequence repetition rate, i.e. the frequency of repetition of the sequence shown in FIG. 3 would lie in the range 1 kHz to 100 MHz, and the sequence would be interrupted (gated) during indexing.

Figure 4:
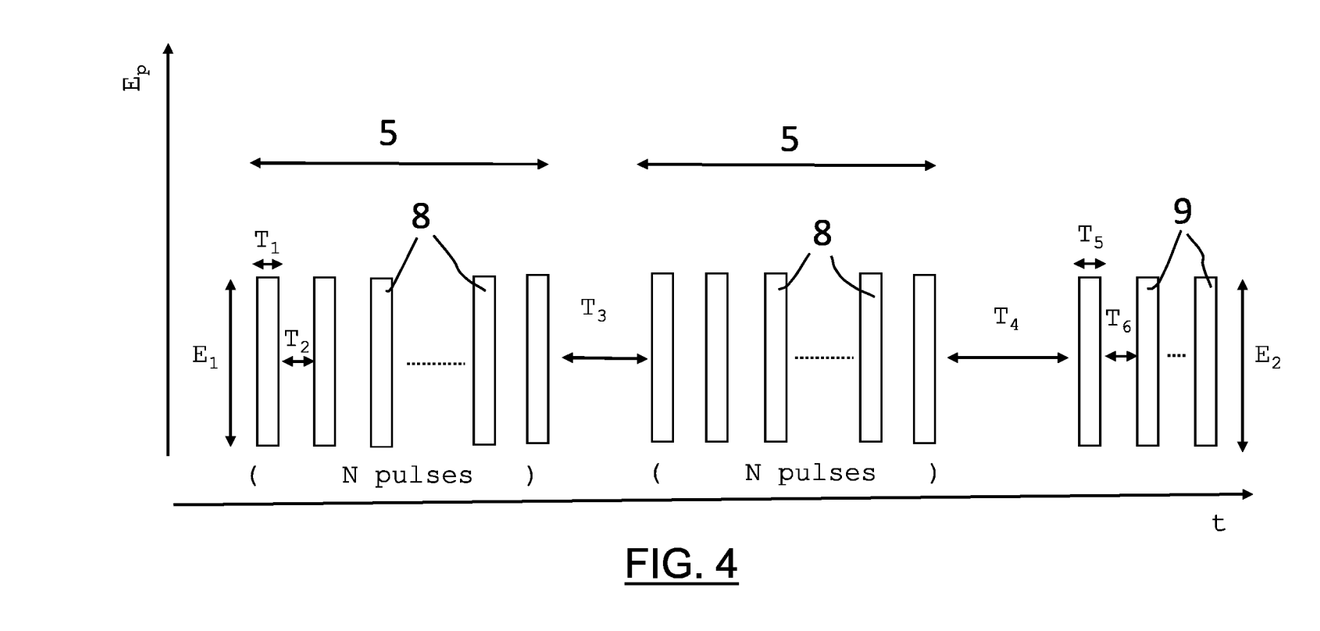
FIG. 4 schematically shows a timing diagram of an irradiation scheme in accordance with a fourth embodiment of the present invention.

A timing diagram of an irradiation scheme in accordance with a fourth embodiment of the present invention is schematically shown in FIG. 4. This irradiation scheme uses a pulse sequence with a first set comprising a plurality of bursts 5, each of a number N of pico-/femtosecond pulses 8, and a second set comprising a plurality of pico-/femtosecond pulses 9 at the end of the sequence.

As shown in FIG. 4:
"Ep" represents the energy of individual laser pulses, which corresponds to the intensity of the laser beam during the pulse;
"t" represents time;
$T_1$, the duration of each pulse 8, lies in the range from 10 fs to 100 ps;
$T_2$, the inter-pulse spacing between successive pico-/femtosecond pulses 8 within burst 5, lies in the range from 100 ps to 100 ns;
$T_3$, the inter-burst spacing between successive bursts 5, lies in the range from 0.1 to 100 nanoseconds;
$T_4$ represents the inter-pulse spacing between the final pico-/femtosecond pulse 8 of the final burst 5 and the following pico-/femtosecond pulse 9. $T_4$ may lie within a relatively wide range of values, since it may encompass cutting/scribing/grooving an entire wafer, however will likely be at least 100 ps;

$T_5$, the duration of each pulse 9, lies in the range from 10 fs to 100 ps;

$T_6$, the inter-pulse spacing between successive pico-/femtosecond pulses 9, lies in the range from 10 ns to 1 ms;

N, the number of pico-/femtosecond pulses 6 in each burst 5, lies in the range $2 \leq N \leq 100$;

$E_2$, the energy of pico-/femtosecond pulse 9 in this embodiment substantially equals $E_1$, the energy of each pico-/femtosecond pulse 8. In other, related embodiments, the energies may differ.

Each burst 5 of pico-/femtosecond pulses 8 acts similarly to a single nanosecond pulse, and so the scheme of FIG. 4 is conceptually similar to the scheme shown in FIG. 2. However, the scheme of FIG. 4 may be simpler to produce in practice than the scheme of FIG. 2 since the laser source may exclusively emit pico-/femtosecond pulses, rather than switching between pico-/femtosecond pulses and nanosecond pulses.

The sequence in FIG. 4. could be as long as the processing time for an entire wafer (for example from about one minute to over an hour). For example, the single sequence shown could be employed to cut a wafer using nanosecond burst envelopes and then post-process with ultra-short pulses. Therefore this sequence need not be repeated while processing a single groove or cut-line in the wafer.

Figure 5:
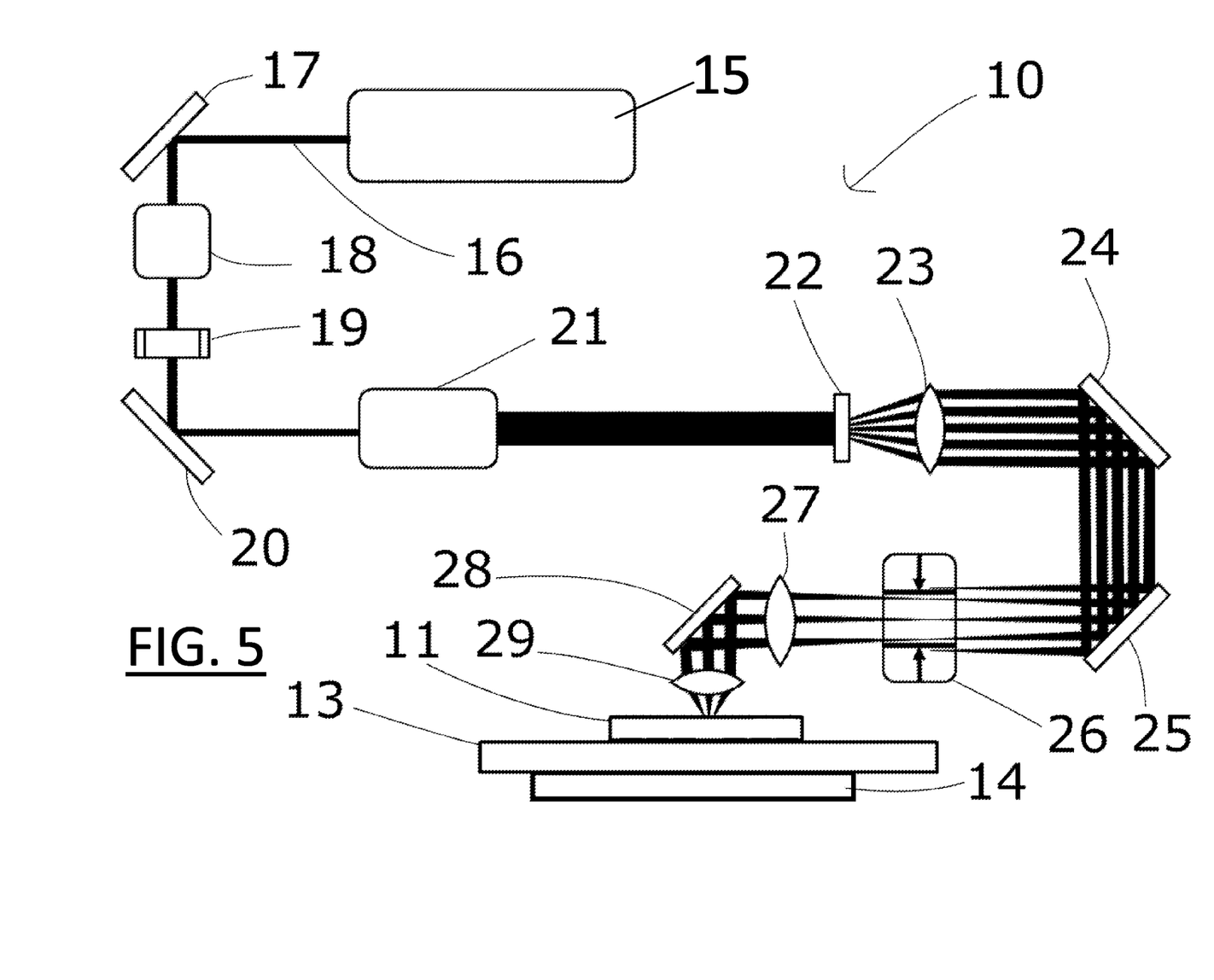
FIG. 5 schematically shows a laser cutting apparatus for enabling the method of the present invention.

A laser-cutting apparatus 10 suitable for performing the method of the present invention is schematically shown in FIG. 5.

A semiconductor material, here a semiconductor wafer 11, is supported on a chuck 13. Chuck 13, and hence wafer 11, are driven in use by a drive 14, so that there is relative movement between the wafer 11 and the irradiating laser light (see below). A pulse laser source 15 is adapted to output pulses of polarized laser beam 16 in accordance with a timing schedule such as that described above. The laser source 15 is operative to output laser beam pulses, i.e. a pulsed laser beam 16. Typically, laser source 15 would include a modulator (not shown), for example between its oscillator and amplifier, which is capable of adjusting the intensity of the emitted laser pulses, and thus controlling the values of $E_1$ and $E_2$ described with reference to FIGS. 1 to 4 above. In other embodiments (not shown), an external modulator may be used to enable such intensity control. The pulsed laser beam 16 is guided by an assembly to the wafer 11. In more detail, a mirror 17 guides the beam 16 an attenuator/shutter 18 for control of the beam. A selectively actuable optical polarizing component, here in the form of a motorised half-wave plate 19, is provided to be selectively movable for interaction with the pulsed laser beam 16. Preferably the half-wave plate 19 is mounted for rotation around the laser beam axis. Therefore, by selectively rotating half-wave plate 19 the polarization state of the laser beam 16 can be controlled in a switching manner. The selective movement is implemented by controlled operation of the motor by a control means (not shown) such as a computer, processor or the like. Another mirror 20 guides the pulsed laser beam 16 to a beam expander 21 to produce a widened beam. A diffractive optical element ("DOE") 22 diffracts or splits the widened beam into a predetermined pattern of spatially-separated output sub-beams. Lenses 23 and 27 together form a relay telescope. Further mirrors 24, 25 guide the sub-beams to a spatial filter 26, which is used to form a desired predetermined beam pattern. Spatial filter 26 is located in an intermediate focus that is created by lens 23. Mirror 28 guides the sub-beams to a focusing lens 29. This focuses laser light to the wafer 11 on the supporting chuck 13, in a predetermined pattern of illumination spots. By moving the wafer relative to the irradiating pulsed laser beam 16, the laser beam pulses irradiate and thus cut the wafer 11 along a cutting line (not shown).

Bursts of ultra-short pulses can be created by seeding an amplifier with multiple pulses from a seed laser (oscillator). Another option is to only partially dump a pulse from a regenerative amplifier such that another pulse can be created after one additional cavity round-trip time. These are standard options for many commercially-available lasers. Creating nanosecond pulses from the same laser may be achieved for example by switching between multiple seed lasers or operating a regenerative amplifier in a Q-switched mode. In another embodiment (not shown) the laser source may comprise two separate lasers to provide nanosecond pulses and ultra-short pulses respectively.

Depending on the semiconductor material to be cut, and the type of cutting operation (such as grooving, singulation etc.), it may be advantageous to change the laser beam pulse characteristics between successive pulses or bursts within a sequence or scheme. For example, by suitable control of the laser source 15, successive bursts in a scheme may have different pulse repetition frequencies. Alternatively or additionally, the energy transmitted in successive bursts or pulses may be different, for example by controlling a modulator either internal or external to the laser source such that a pulse energy of a pulse within a first burst is different to a pulse energy of a pulse within a second or subsequent burst.

Alternatively or additionally, the polarisation of the emitted laser beam pulses may be controlled, for example by selective rotation of half-wave plate 19, such that different laser beam pulses within a scheme or sequence may have different laser beam polarisation states. For example, the laser beam pulses of a burst may have linear polarisation, for example parallel or perpendicular to the cutting line, while a subsequent laser beam pulse may be linearly polarised with a polarisation direction orthogonal to the polarisation of the laser beam pulses of the burst. It is also possible to cause one or more laser beam pulses of a sequence or scheme to be circularly or elliptically polarised, for example by selective application of a quarter-wave plate (not shown) in the path of the laser beam 16.

As noted above, a DOE 22 may be used to diffract the beam 16 into a predetermined pattern of output laser sub-beams, which, in conjunction with spatial filter 26, forms a desired predetermined pattern of irradiation spots on the semiconductor material. It may be advantageous to create different patterns of irradiation spots for different pulses or bursts within a scheme or sequence, in other words the laser beam pulses of successive pulses or bursts may be split such that the pattern of irradiation spots associated with a first burst or pulse in a scheme is different to the pattern of irradiation spots associated with the next burst or pulse in a scheme. This effect may be achieved in a number of ways, for example by selecting a different DOE for the second burst or pulse, or by adjusting the spatial filter 26 between bursts or pulses. In a refinement of this technique, the irradiation spots produced during successive bursts or pulses may be respectively spatially separated, to irradiate different cutting lines in the semiconductor material. In this way, a first burst or pulse could be used to create trench lines which run parallel to, but spaced from, the main cut line, while a subsequent burst or pulse could be used to produce a main cut line.

The above-described embodiments are exemplary only, and other possibilities and alternatives within the scope of the invention will be apparent to those skilled in the art. For example, while in the specific embodiments described above relative movement between the semiconductor material and the irradiating laser beam pulses is caused by moving the semiconductor material while keeping the laser optics stationary, in alternative embodiments the relative motion may be provided by keeping the semiconductor material stationary and moving the laser and/or the laser optics, or alternatively both the semiconductor material and the laser and/or laser optics may be moved.

In the specific embodiments described above, the individual laser beam pulses are created by the use of a pulsed laser. However, it is theoretically possible to use an external beam-chopping mechanism to create individual pulses, for example using a fast-spinning wheel with a plurality of blocking elements that are successively placed in the laser beam path.

The relative energies of first and second sets may be varied as required for the particular application.

In other embodiments (not shown), in addition to the first and second sets, there may be third and additional sets of laser beam pulses within each sequence as appropriate for the particular application.

REFERENCE NUMERALS USED

1—Nanosecond pulse
2—Pico-/femtosecond pulse
3—Nanosecond pulse
4—Pico-/femtosecond pulse
5—Pulse burst
6—Pico-/femtosecond pulse
7—Pico-/femtosecond pulse
8—Pico-/femtosecond pulse
9—Pico-/femtosecond pulse
10—Laser cutting apparatus
11—Wafer
13—Chuck
14—Drive
15—Pulsed laser source
16—Laser beam
17, 20, 24, 25, 28—Mirrors
18—Attenuator/shutter
19—Motorised half-wave plate
21—Beam expander
22—Diffractive optical element
23, 27, 29—Lens
26—Spatial filter

The invention claimed is:

1. A method of singulating or scribing a wafer along a line by irradiating the wafer with laser energy, comprising the steps of:
  i) providing a laser source adapted to emit a sequence of successive laser beam pulses,
  ii) emitting laser beam pulses from the laser source,
  iii) guiding the emitted laser beam pulses along a laser beam pulse direction to irradiate the wafer to be singulated or scribed,
  iv) while the emitted laser beam pulses are irradiating the wafer, moving the wafer relative to the irradiating laser beam pulses and orthogonally to the laser beam pulse direction to singulate or scribe the wafer along a line, and
  v) cyclically repeating the sequence of laser beam pulses, wherein the sequence of laser beam pulses comprises: first and second sets of laser beam pulses,
  the first set comprising:
  at least one burst of laser beam pulses, each pulse within the burst having a pulse width of 100 picoseconds or less, and
  the second set comprising at least one laser beam pulse having a pulse width of 100 picoseconds or less,
  wherein the first set of laser beam pulses is used to form at least one singulation or scribe line in the wafer, and the at least one laser beam pulse of the second set is used to perform post-processing subsequent to singulating or scribing of the at least one formed singulation or scribe line, and
  wherein each sequence comprises the at least one burst of laser beam pulses of the first set followed by the at least one laser beam pulse of the second set, with the gap between the at least one burst of laser beam pulses of the first set and the at least one laser beam pulse of the second set being at least 100 ps.

2. The method of claim 1, wherein the plurality of bursts of laser beam pulses of the first set have an inter-burst spacing in the range from 0.1 to 100 nanoseconds.

3. The method of claim 1, wherein the first set of each sequence consists of a single burst of laser beam pulses, each pulse within the single burst of laser beam pulses having a pulse width of 100 picoseconds or less, and the second set of each sequence consists of a single laser beam pulse, the single laser beam pulse of the second set having a pulse width of 100 picoseconds or less, such that the wafer is alternatingly irradiated with the single burst of laser beam pulses of the first set and the single laser beam pulse of the second set.

4. The method of claim 3, wherein the gap between the first set and the single laser beam pulse of the second set is between 100 ps and 1 ms.

5. The method of claim 1, wherein each sequence comprises at least two bursts of laser beam pulses of the first set, followed by the laser beam pulse of the second set.

6. The method of claim 1, wherein each sequence comprises the at least one burst of laser beam pulses of the first set, followed by at least two successive laser beam pulses of the second set.

7. The method of claim 1, wherein the energy of each laser beam pulse of the second set of laser beam pulses is different from the energy of each laser beam pulse of the first set of laser beam pulses.

8. The method of claim 7, wherein the energy of each laser beam pulse of the second set of laser beam pulses is greater than the energy of each laser beam pulse of the first set of laser beam pulses.

9. The method of claim 7, wherein the energy of each laser beam pulse of the second set of laser beam pulses is lower than the energy of each laser beam pulse of the first set of laser beam pulses.

10. The method of claim 1, comprising the step of controlling the polarisation of the emitted laser beam pulses, such that the laser beam pulses of the second set have a different laser beam polarisation state from those of the first set.

11. The method of claim 1, wherein the second set removes part or all of the damage created by the first set during the singulating or scribing.

* * * * *